(12) United States Patent
Han et al.

(10) Patent No.: US 11,569,292 B2
(45) Date of Patent: Jan. 31, 2023

(54) DISPLAY APPARATUS AND MANUFACTURING METHOD THEREOF

(71) Applicant: SAMSUNG ELECTRONICS CO., LTD., Suwon-si (KR)

(72) Inventors: Seungryong Han, Suwon-si (KR); Hyunsun Kim, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 132 days.

(21) Appl. No.: 17/023,741

(22) Filed: Sep. 17, 2020

(65) Prior Publication Data
US 2021/0091138 A1 Mar. 25, 2021

(30) Foreign Application Priority Data

Sep. 23, 2019 (KR) .................. 10-2019-0117039

(51) Int. Cl.
*H01L 27/15* (2006.01)
*H01L 33/00* (2010.01)
(Continued)

(52) U.S. Cl.
CPC .......... *H01L 27/156* (2013.01); *H01L 33/005* (2013.01); *H01L 33/486* (2013.01);
(Continued)

(58) Field of Classification Search
CPC ... H01L 27/156; H01L 33/005; H01L 33/486; H01L 33/52; H01L 33/58; H01L 33/62;
(Continued)

(56) References Cited

U.S. PATENT DOCUMENTS

2016/0381821 A1 12/2016 Xiao et al.
2017/0077436 A1* 3/2017 Yue .................. G06F 3/1446
(Continued)

FOREIGN PATENT DOCUMENTS

EP          3 477 699 A1    5/2019
KR    10-2019-0041413 A    4/2019
(Continued)

OTHER PUBLICATIONS

Communication dated Feb. 25, 2021 by the European Patent Office in corresponding European Application No. 20197498.7.
(Continued)

*Primary Examiner* — Victor A Mandala
(74) *Attorney, Agent, or Firm* — Sughrue Mion, PLLC

(57) ABSTRACT

A display apparatus including: a plurality of display modules, each including a substrate and inorganic light emitting diodes mounted on a mounting surface of the substrate; a cover layer configured to cover the mounting surface of each of the display modules; and an adhesive layer arranged between the cover layer and the mounting surface of each of the display modules to cause the cover layer to adhere to the mounting surface of each of the display modules, wherein the adhesive layer includes a first region, disposed on a gap formed between the plurality of display modules, and a second region disposed on the mounting surface of each of the display modules, and wherein the adhesive layer includes a photosensitive material such that the first region of the adhesive layer is configured to undergo a photosensitive reaction based on an external light source.

20 Claims, 18 Drawing Sheets

(51) Int. Cl.
　　　*H01L 33/48*　　(2010.01)
　　　*H01L 33/52*　　(2010.01)
　　　*H01L 33/58*　　(2010.01)
　　　*H01L 33/62*　　(2010.01)
(52) U.S. Cl.
　　　CPC .............. *H01L 33/52* (2013.01); *H01L 33/58* (2013.01); *H01L 33/62* (2013.01); *H01L 2933/0058* (2013.01); *H01L 2933/0066* (2013.01)
(58) Field of Classification Search
　　　CPC ..... H01L 2933/0058; H01L 2933/0066; H01L 25/0753; H01L 27/1214; H01L 27/1259; H01L 27/1262; H01L 33/0045; G02F 2202/28; G02F 1/13336; G09F 9/33
　　　See application file for complete search history.

(56) References Cited

U.S. PATENT DOCUMENTS

| | | |
|---|---|---|
| 2018/0120627 A1 | 5/2018 | Ni et al. |
| 2019/0122592 A1 | 4/2019 | Han et al. |
| 2019/0131381 A1* | 5/2019 | Tang .................... H01L 27/3293 |
| 2020/0075820 A1* | 3/2020 | Han ........................ H01L 33/62 |
| 2020/0083315 A1* | 3/2020 | Yueh ........................ H01L 27/3237 |
| 2020/0301193 A1* | 9/2020 | Lee .................... G02F 1/133308 |
| 2020/0303608 A1* | 9/2020 | Song ........................ H01L 33/38 |
| 2020/0313055 A1* | 10/2020 | Su ........................ H01L 25/0753 |
| 2020/0337160 A1* | 10/2020 | Hsiao ................. G02F 1/13336 |
| 2021/0159307 A1* | 5/2021 | Kwon ................ H01L 27/3293 |

FOREIGN PATENT DOCUMENTS

| | | |
|---|---|---|
| KR | 10-2019-0046684 A | 5/2019 |
| WO | 2019/026858 A1 | 2/2019 |

OTHER PUBLICATIONS

International Search Report (PCT/ISA/210) dated Jan. 22, 2021 by the International Searching Authority in International Application No. PCT/KR2020/012871.

\* cited by examiner

DISPLAY APPARATUS AND MANUFACTURING METHOD THEREOF

CROSS-REFERENCE TO THE RELATED APPLICATION

This application is based on and claims priority under 35 U.S.C. § 119 to Korean Patent Application No. 10-2019-0117039, filed on Sep. 23, 2019, in the Korean Intellectual Property Office, the disclosure of which is herein incorporated by reference in its entirety.

BACKGROUND

1. Field

Embodiments of the disclosure relate to a display apparatus capable of displaying an image by coupling modules, in which an inorganic light emitting diode, which is self-luminous, is mounted on a substrate, to each other, and a manufacturing method thereof.

2. Description of Related Art

A display apparatus is a type of output device that visually displays a piece of data information, such as text or graphics, and images.

A liquid crystal panel or an organic light emitting diode (OLED) panel that is formed by depositing an OLED on a substrate has been used as a conventional display apparatus. However, the liquid crystal panel has difficulties such as a slow reaction time, and large power consumption. Further, the liquid crystal panel does not emit light itself and thus requires a backlight. Therefore, the liquid crystal panel has difficulties in the compact design. In addition, OLED panels have a short service life and poor production yield rates. In particular, because the OLED panel is self-luminous and it does not require a backlight, it is possible make a thickness of the OLED thin. However, the OLED panel may have a difficulty such as screen burn-in (deterioration). Screen burn-in is a phenomenon that when the same image is displayed for long time, a certain part of the previous image remains due to the degradation of sub-pixels even if the image is changed.

Accordingly, as a new panel to replace the OLED panel, a micro light emitting diode (micro LED or pLED) display panel, which mounts an inorganic light emitting diode on a substrate and uses the inorganic light emitting diode itself as a pixel, has been studied.

The micro LED display panel may be a flat panel display panel that is composed of a plurality of inorganic light emitting diodes (inorganic LEDs) of 100 micrometers or less.

Because the micro LED display panel does not need a backlight and may have a minimized bezel, it is possible to implement compact and thin designs and to have excellent brightness, resolution, power consumption, and durability.

In comparison with a liquid crystal display (LCD) panel that requires a backlight, the micro LED display panel provides better contrast, response time, and energy efficiency. Both organic light emitting diodes (OLEDs) and micro LEDs corresponding to inorganic light emitting diodes have good energy efficiency, but the micro LEDs have better brightness, luminous efficiency and a longer service life than the OLEDs.

In addition, because there is no complicated process other than a process of picking up inorganic light emitting diodes from a wafer and transferring the inorganic light emitting diodes to a substrate, the micro LED display panel may be manufactured in various resolutions and sizes according to a customer's order and it is easy to implement a big screen by assembling unit panel modules. However, when assembling the unit panels, a gap may inevitably occur in a seam between the panels, which may cause deterioration of image quality.

SUMMARY

Therefore, it is an aspect of embodiments of the disclosure to provide a display apparatus capable of, when implementing a large-size screen by assembling a plurality of display modules adjacent to each other, minimizing degradation in image quality caused by a gap between the plurality of display modules, and a manufacturing method thereof.

Additional aspects of embodiments of the disclosure will be set forth in part in the description which follows and, in part, will be understood from the description, or may be learned by practice of the disclosure.

According to one or more embodiments, a display apparatus is provided. The display apparatus may include a plurality of display modules, each of the plurality of display modules including a substrate and a plurality of inorganic light emitting diodes mounted on a mounting surface of the substrate; a cover layer configured to cover the mounting surface of each of the plurality of display modules; and an adhesive layer arranged between the cover layer and the mounting surface of each of the plurality of display modules to cause the cover layer to adhere to the mounting surface of each of the plurality of display modules. The adhesive layer may include a first region, disposed on a gap formed between the plurality of display modules, and a second region disposed on the mounting surface of each of the plurality of display modules, and the adhesive layer may include a photosensitive material such that the first region of the adhesive layer is configured to undergo a photosensitive reaction based on an external light source.

The first region may be configured to be colored to a color darker than the second region by the photosensitive reaction.

The first region may be configured to generate a change in physical properties by the photosensitive reaction so that the first region becomes a light absorbing region.

Each display module of the plurality of display modules may further include a black matrix disposed between the plurality of inorganic light emitting diodes of the display module.

Each display module of the plurality of display modules may further include an anisotropic conductive layer configured to electrically connect contact electrodes of the plurality of inorganic light emitting diodes of the display module to pad electrodes of the substrate of the display module.

The black matrix may be formed on the anisotropic conductive layer.

The black matrix may be patterned on the anisotropic conductive layer.

The black matrix may be formed on the cover layer.

The black matrix may be formed on the second region.

The first region and the black matrix may be formed of different materials.

The adhesive layer may be formed of any one of an optical clear adhesive (OCA) or optical clear resin (OCR).

The substrate of each of the plurality of display modules may include a glass substrate, and a thin film transistor (TFT) layer formed on the glass substrate to drive the plurality of inorganic light emitting diodes.

The substrate of each of the plurality of display modules comprises a light absorbing layer formed entirely in a mounting surface side of the substrate so as to improve contrast by absorbing external light.

The adhesive layer may include a first layer and a second layer, the first layer in contact with the mounting surface of each of the plurality of display modules and including the photosensitive material, and the second layer disposed on the first layer and not including the photosensitive material.

The substrate of each of the plurality of display modules may include a block layer disposed on a side of the plurality of display modules opposite to the mounting surface of each of the plurality of display modules.

According to one or more embodiments, a manufacturing method of a display apparatus is provided. The manufacturing method may include: preparing a plurality of display modules, each of the plurality of display modules formed by mounting a plurality of inorganic light emitting diodes on a mounting surface of a respective substrate; arranging the plurality of display modules to be adjacent to each other; arranging a photosensitive transparent adhesive layer on the mounting surface of each of the plurality of display modules and arranging a cover layer on the photosensitive transparent adhesive layer to cover the mounting surface of each of the plurality of display modules; bonding the cover layer to the plurality of display modules through the photosensitive transparent adhesive layer; and irradiating a light source toward a gap formed between the plurality of display modules from a side of the plurality of display modules opposite to the mounting surface of each of the plurality of display modules.

The irradiating the light source toward the gap may include irradiating a first region of the photosensitive transparent adhesive layer disposed on the gap such that a photosensitive reaction in the first region occurs by the light source, without irradiating a second region disposed on the mounting surface of each of the plurality of display modules such that the photosensitive reaction does not occur in the second region.

The arranging the photosensitive transparent adhesive layer may include bonding an optical adhesive, which is formed of any one of an optical clear adhesive (OCA) or optical clear resin (OCR) and includes a photosensitive material, to the mounting surface of each of the plurality of display modules.

The manufacturing may further include forming a black matrix between the plurality of inorganic light emitting diodes on the mounting surface of each of the plurality of display modules.

According to one or more embodiments, a display apparatus is provided. The display apparatus may include: a plurality of display modules, each of the plurality of display modules including a substrate and a plurality of inorganic light emitting diodes mounted on a mounting surface of the substrate; a cover layer configured to cover the mounting surface of each of the plurality of display modules; and a photosensitive transparent adhesive layer arranged between the cover layer and the mounting surface of the substrate of each of the plurality of display modules to cause the cover layer to adhere to the mounting surface of the substrate of each of the plurality of display modules, wherein the substrate of each of the plurality of display modules includes a black matrix disposed between the plurality of inorganic light emitting diodes on the substrate; and the photosensitive transparent adhesive layer includes a first region and a second region, the first region disposed on a gap formed between the plurality of display modules and configured to undergo a photosensitive reaction based on an external light source, and the second region disposed on the mounting surface of each of the plurality of display modules.

BRIEF DESCRIPTION OF THE DRAWINGS

These and/or other aspects of the disclosure will become apparent and more readily appreciated from the following description of embodiments, taken in conjunction with the accompanying drawings of which.

DETAILED DESCRIPTION

Figure 1A:
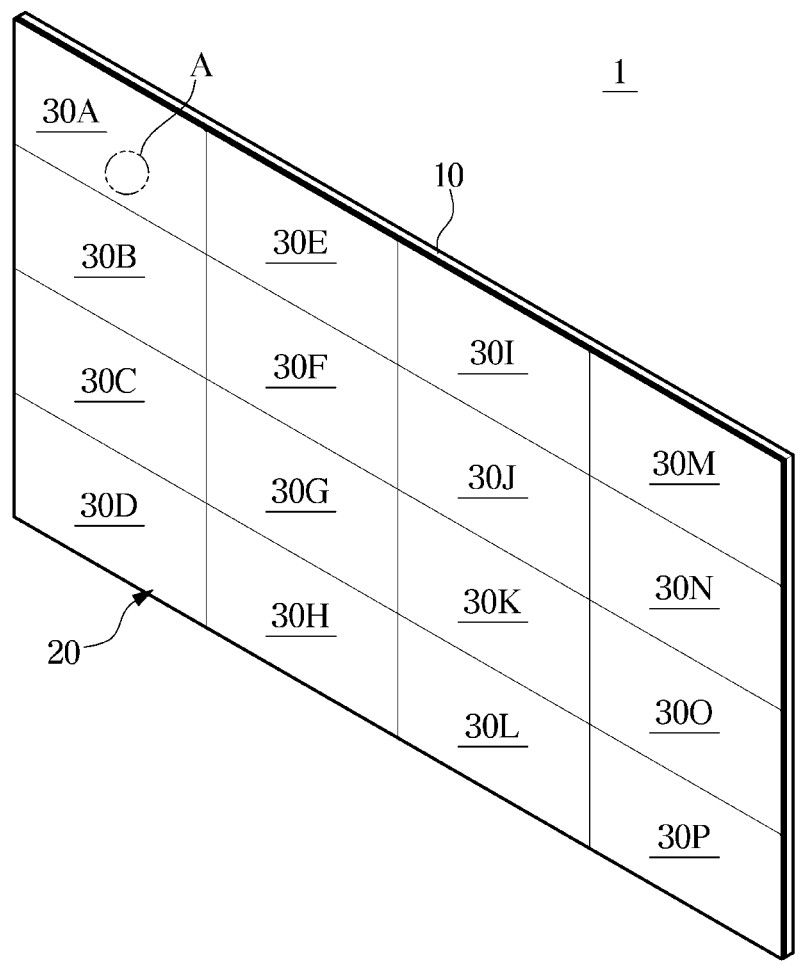
FIG. 1A is a view illustrating a display apparatus according to an embodiment of the disclosure.

Example embodiments described in the disclosure and configurations shown in the drawings are merely examples of the embodiments of the disclosure, and may be modified in various different ways at the time of filing of the present application to replace the example embodiments and drawings of the disclosure.

The singular forms "a," "an" and "the" are intended to include the plural forms as well, unless the context clearly indicates otherwise. For a clear description, the shape and size of the elements may be emphasized in the drawings.

In this disclosure, the terms "including", "having", and the like are used to specify features, numbers, steps, operations, elements, components, or combinations thereof, but do not preclude the presence or addition of one or more of the features, elements, steps, operations, elements, components, or combinations thereof.

Embodiments of the disclosure will be described more fully hereinafter with reference to the accompanying drawings.

Figure 1B:
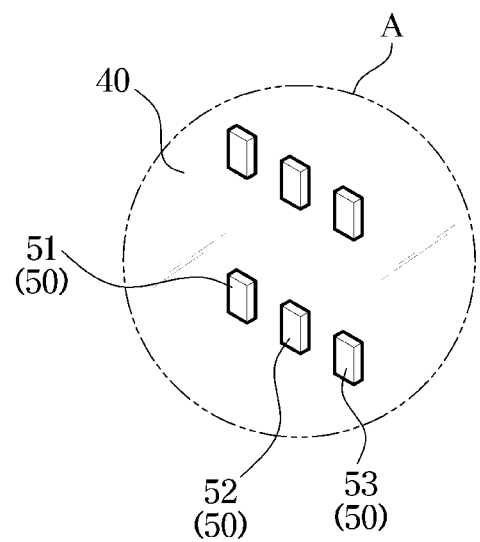
FIG. 1B is a magnified view of a portion of the display apparatus of FIG. 1A.
Figure 2:
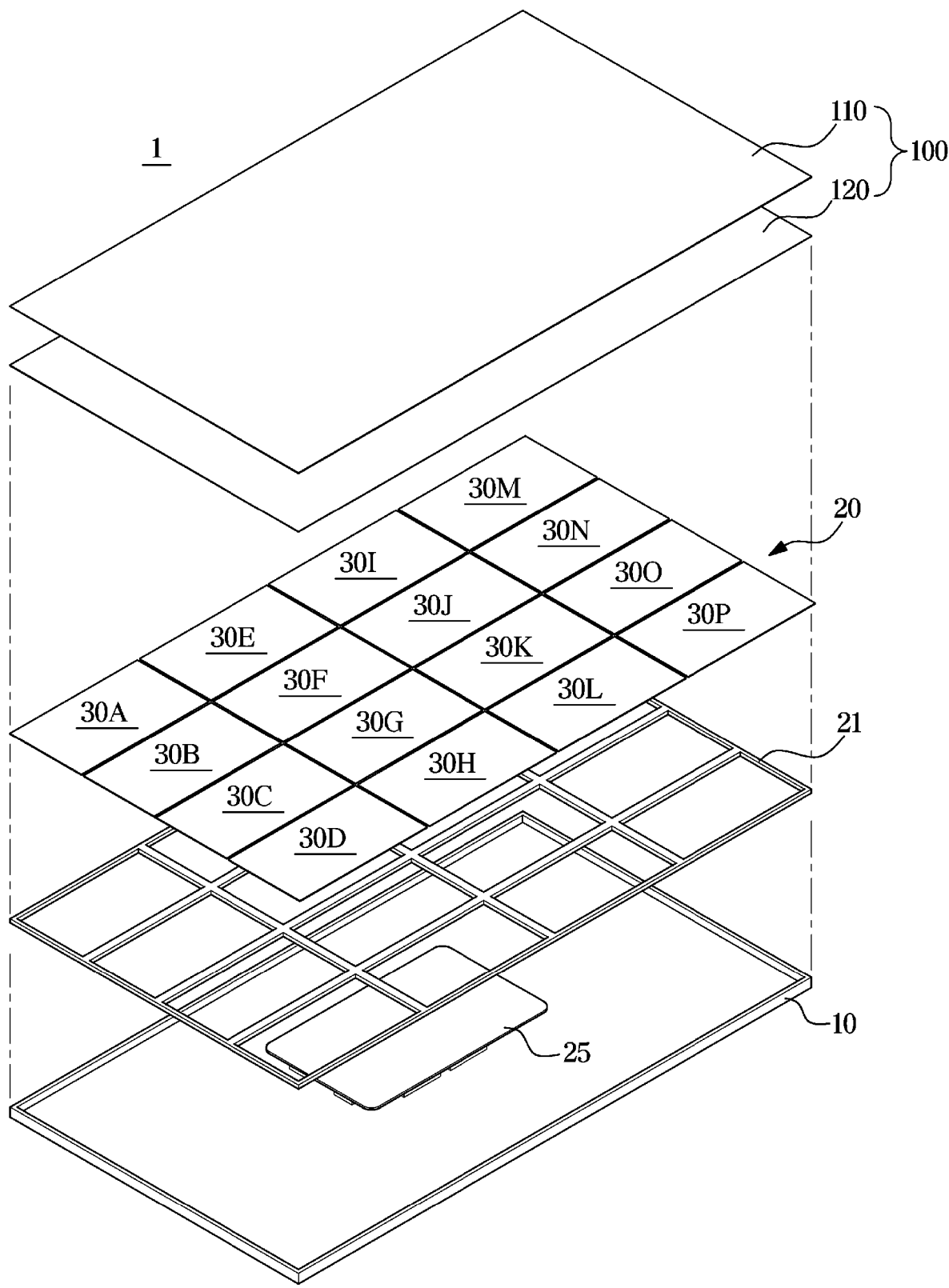
FIG. 2 is an exploded view of main components of the display apparatus of FIG. 1.
Figure 3:
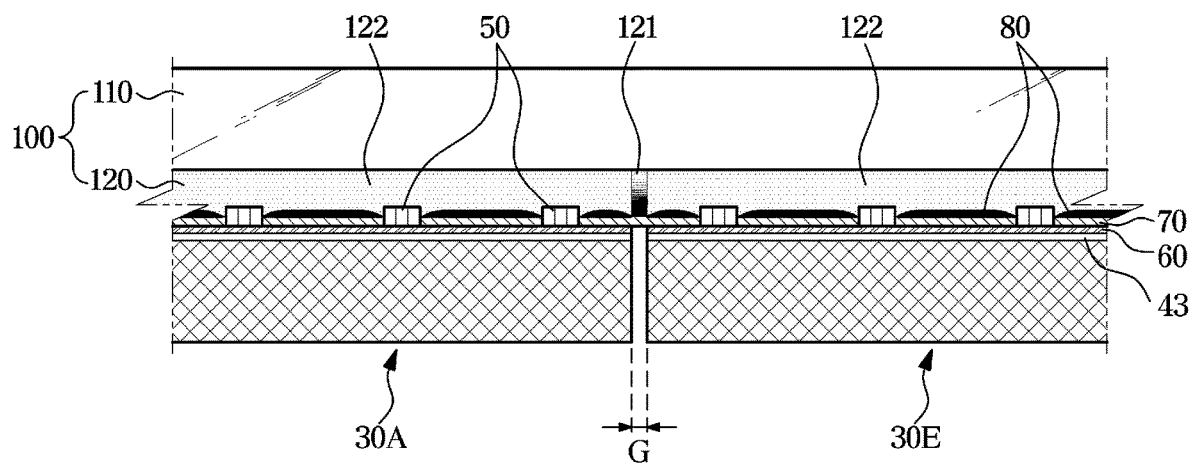
FIG. 3 is a cross-sectional view of some components of the display apparatus of FIG. 1.
Figure 4:
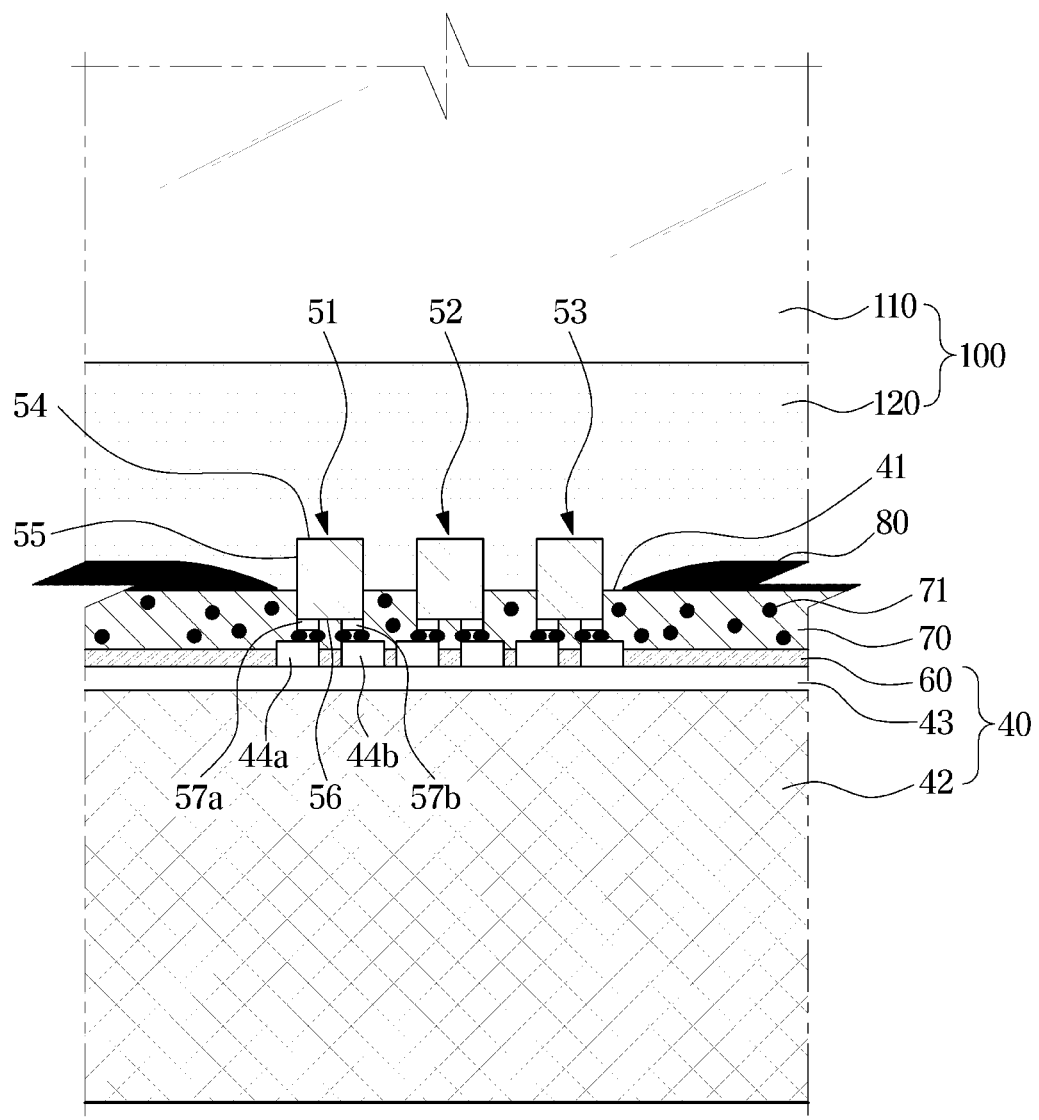
FIG. 4 is an enlarged cross-sectional view of some components of the display apparatus of FIG. 3.

FIG. 1A is a view illustrating a display apparatus according to an embodiment of the disclosure, FIG. 1B is a magnified view of a portion A of the display apparatus of FIG. 1A, FIG. 2 is an exploded view of main components of the display apparatus of FIG. 1, FIG. 3 is a cross-sectional view of some components of the display apparatus of FIG. 1A, and FIG. 4 is an enlarged cross-sectional view of some components of the display apparatus of FIG. 3.

Some components of the display apparatus 1 as well as a plurality of inorganic light emitting diodes 50 shown in the drawings are micro-unit components having a size of several μm to several hundreds of μm, and thus some components (a plurality of inorganic light emitting diodes 50, black matrix 80, etc.) are exaggerated for convenience of description.

The display apparatus 1 is a device configured to display information, materials, data and the like with characters, figures, graphs, images, etc., and TV, personal computer (PC), mobile, and digital signage may be implemented with the display apparatus 1.

According to an embodiment of the disclosure, the display apparatus 1 may include a display panel 20 on which an image is displayed, a frame 21 configured to support the display panel 20, and a rear cover 10 configured to cover a rear surface of the frame 21.

The display panel 20 may include a plurality of display modules 30A-30P and an encapsulation layer 100 formed on the plurality of display modules 30A-30P to cover a plurality of inorganic light emitting diodes 50 and each mounting surface 41 (see FIG. 4) of the display modules 30A-30P.

The rear cover 10 may support the display panel 20. The display apparatus 1 may be installed on the floor through a stand (not shown), or may be installed on a wall through a hanger (not shown). The display apparatus 1 may include a power supply device (not shown) configured to supply power to the plurality of display modules 30A-30P, and a control board 25 configured to control an operation of the plurality of display modules 30A-30P.

The plurality of display modules 30A-30P may be arranged vertically and horizontally adjacent to each other. The plurality of display modules 30A-30P may be arranged in a matrix form of M*N. In this embodiment, the plurality of display modules 30A-30P is provided and arranged in a matrix form of 4*4, but the number and arrangement of the plurality of display modules 30A-30P are not limited thereto.

The plurality of display modules 30A-30P may be installed in the frame 21. The plurality of display modules 30A-30P may be installed on the frame 21 through various known methods such as magnetic force using a magnet or mechanical fitting structure. The rear cover 10 may be coupled to the rear of the frame 21, and the rear cover 10 may form a rear appearance of the display apparatus 1.

As described above, the display apparatus 1 according to an embodiment of the disclosure may implement a large screen by tiling the plurality of display modules 30A-30P.

According to an embodiment, each single display module among the plurality of display modules 30A-30P may be applied to a display apparatus. That is, as a single unit, a display module may be installed and applied to a wearable device, a portable device, a handheld device and various electronic products and electronic components, which need a display. Alternatively, according to an embodiment of the disclosure, the display modules 30A-30P may be applied to a display apparatus such as a personal computer (PC) monitor, a high-resolution TV, a signage, and an electronic display through a plurality of assemblies and arrangements in the matrix type. The plurality of display modules 30A-30P may have the same configuration. Therefore, the description of any one of the display modules described below may be applied equally to all other display modules.

A display module 30A includes a substrate 40 and a plurality of inorganic light emitting diodes 50 mounted on the substrate 40. The substrate 40 may include a base substrate 42 and a thin film transistor (TFT) layer 43 formed on the base substrate 42 to drive the inorganic light emitting diodes 50. The base substrate 42 may include a glass substrate. That is, the substrate 40 may include a chip on glass (COG) type substrate. A first pad electrode 44a and a second pad electrode 44b to which the inorganic light emitting diodes 50 are electrically connected may be formed on the substrate 40.

Thin film transistor (TFT) forming the TFT layer 43 is not limited to a specific structure or type, and may be configured in various embodiments. That is, the TFTs of the TFT layer 43 according to an embodiment of the disclosure may be implemented as Low Temperature Poly Silicon (LTPS) TFT, oxide TFT, silicon TFT (poly silicon TFT or amorphous silicon (a-si) TFT), organic TFT, or graphene TFT.

Alternatively, the TFT layer 43 may be replaced with a Complementary Metal-Oxide Semiconductor (CMOS) type or n-type metal oxide silicon field effect transistor (MOSFET) or p-type MOSFET when the base substrate 42 of the substrate 40 is provided with a silicon wafer.

The plurality of inorganic light emitting diodes 50 may include an inorganic light emitting diode formed of inorganic materials and having several μm to several hundreds of μm in a horizontal length, a vertical length, and a height. A micro-inorganic light emitting diode may be in a size in which a length of a short side among a horizontal length, a vertical length, and a height is 100 μm or less. That is, each of the inorganic light emitting diodes 50 may be picked up from a wafer formed of silicon or sapphire material and directly transferred onto the substrate 40. The plurality of inorganic light emitting diodes 50 may be picked up and transferred through an electrostatic method using an electrostatic head or an adhesive method using elastic polymer materials such as PDMS or silicone as a head.

The plurality of inorganic light emitting diodes 50 may be a light emitting structure including an n-type semiconductor, an active layer, a p-type semiconductor, a first contact electrode 57a, and a second contact electrode 57b. The plurality of inorganic light emitting diodes 50 may be in the form of a flip chip in which the first contact electrode 57a and the second contact electrode 57b are disposed in the same direction (opposite to a light emission direction).

That is, each of the inorganic light emitting diodes 50 may include a light emitting surface 54, a side surface 55, and a bottom surface 56. The first contact electrode 57a and the second contact electrode 57b may be formed on the bottom surface 56.

The first contact electrode 57a and the second contact electrode 57b may be electrically connected to the first pad electrode 44a and the second pad electrode 44b formed on the mounting surface 41 side of the substrate 40, respectively.

An anisotropic conductive layer 70 may be formed on the substrate 40 to mediate electrical bonding between the first and second contact electrodes 57a and 57b and the first and second pad electrodes 44a and 44b. The anisotropic conductive layer 70 may be formed in such a way that an anisotropic conductive adhesive is attached to a protective film, and the anisotropic conductive layer 70 may have a structure in which a conductive ball 71 is dispersed in adhesive resin. The conductive ball 71 corresponds to a conductive sphere surrounded by a thin insulating film, and the conductive ball 71 may electrically connect a conductor to another conductor when the insulating film is broken by a pressure.

The anisotropic conductive layer 70 may include anisotropic conductive film (ACF) in the form of a film and anisotropic conductive paste (ACP) in the form of a paste.

Therefore, when a pressure is applied to the anisotropic conductive layer 70 in a process of mounting the plurality of inorganic light emitting diodes 50 on the substrate 40, the insulating film of the conductive ball 71 may be broken and the first and second contact electrodes 57a and 57b of the inorganic light emitting diodes 50 may be electrically connected to the first and second pad electrodes 44a and 44b of the substrate 40.

However, although not shown in the drawing, the plurality of inorganic light emitting diodes 50 may be mounted on the substrate 40 through solder (not shown) instead of the anisotropic conductive layer 70. After one or more of the inorganic light emitting diodes 50 is aligned on the substrate 40, the one or more of the inorganic light emitting diodes 50 may be bonded to the substrate 40 through a reflow process.

The plurality of inorganic light emitting diodes 50 may include a red light emitting diode 51, a green light emitting diode 52, and a blue light emitting diode 53. The inorganic light emitting diodes 50 may be mounted on the mounting surface 41 of the substrate 40 in such a way that a serial of the red light emitting diode 51, the green light emitting diode 52, and the blue light emitting diode 53 serves as a single unit. A serial of the red light emitting diode 51, the green light emitting diode 52, and the blue light emitting diode 53 may form a single pixel. At this time, the red light emitting diode 51, the green light emitting diode 52, and the blue light emitting diode 53 may each form a sub-pixel.

The red light emitting diode 51, the green light emitting diode 52, and the blue light emitting diode 53 may be arranged in a line with a predetermined interval according to an embodiment of the disclosure, or alternatively the red light emitting diode 51, the green light emitting diode 52, and the blue light emitting diode 53 may be arranged in various forms such as a triangle.

The substrate 40 may include a light absorbing layer 60 to absorb external light to improve contrast. The light absorbing layer 60 may be formed on an entirety of the mounting surface 41 side of the substrate 40. The light absorbing layer 60 may be formed between the TFT layer 43 and the anisotropic conductive layer 70.

The encapsulation layer 100 may include a cover layer 110 configured to cover the plurality of display modules 30A-30P and an adhesive layer 120 configured to bond the plurality of display modules 30A-30P.

The encapsulation layer 100 may be formed of a single configuration configured to cover the plurality of display modules 30A-30P. The encapsulation layer 100 may include a single one of the cover layer 110 and a single one of the adhesive layer 120.

The cover layer 110 may be formed of glass. The cover layer 110 may be provided to physically protect the plurality of inorganic light emitting diodes 50.

The adhesive layer 120 may be provided to be in contact with the mounting surface 41 of the plurality of the substrate 40 and in contact with a surface of the cover layer 110 facing the mounting surface 41. Accordingly, light generated from the plurality of inorganic light emitting diodes 50 may be irradiated to the outside by sequentially passing through the adhesive layer 120 and the cover layer 110.

The adhesive layer 120 may be an optical clear adhesive (OCA) or optical clear resin (OCR). The optical clear adhesive (OCA) and the optical clear resin (OCR) may be in a very transparent state with a transmittance of 90% or more.

Both the optical clear adhesive (OCA) and the optical clear resin (OCR) may improve visibility and image quality by increasing transmittance through low-reflection properties. That is, in a structure having an air gap, light is lost due to a difference in a refractive index between a film layer and an air layer, but in a structure using the optical clear adhesive (OCA) or the optical clear resin (OCR), a difference in a refractive index between the film layer and the optical adhesive layer decreases and light loss is reduced, and as a result, visibility and image quality may be improved.

That is, the optical clear adhesive (OCA) and the optical clear resin (OCR) may improve image quality as well as simply bonding adjacent layers.

However, the optical clear adhesive (OCA) and the optical clear resin (OCR) are different in that the optical clear adhesive (OCA) is put into the process in the form of a film and the optical clear resin (OCR) is put into the process in the form of liquid.

According to an embodiment of the disclosure, the adhesive layer 120 may be formed of an optical clear adhesive (OCA). In addition, the adhesive layer 120 may be formed of an optical clear adhesive (OCA) including a photosensitive material.

The photosensitive material contained in the adhesive layer 120 may be a polymer material in which physical properties are changed in response to light having a specific wavelength. Particularly, the photosensitive material contained in the adhesive layer 120 may be colored by changing physical properties when light having a wavelength outside a wavelength range of visible light is irradiated.

The light, which has the wavelength outside the wavelength range of visible light, such as ultraviolet (UV) may have a wavelength greater or less than the wavelength range of visible light irradiated from the plurality of inorganic light emitting diodes 50. This is to prevent a change in physical properties of the adhesive layer 120 caused by light irradiated from the plurality of inorganic light emitting diodes 50.

The photosensitive material forming the adhesive layer 120 may be colored to an approximately black or a color similar to black in response to light having a wavelength outside the wavelength range of visible light. This will be described later in detail.

Figure 5:
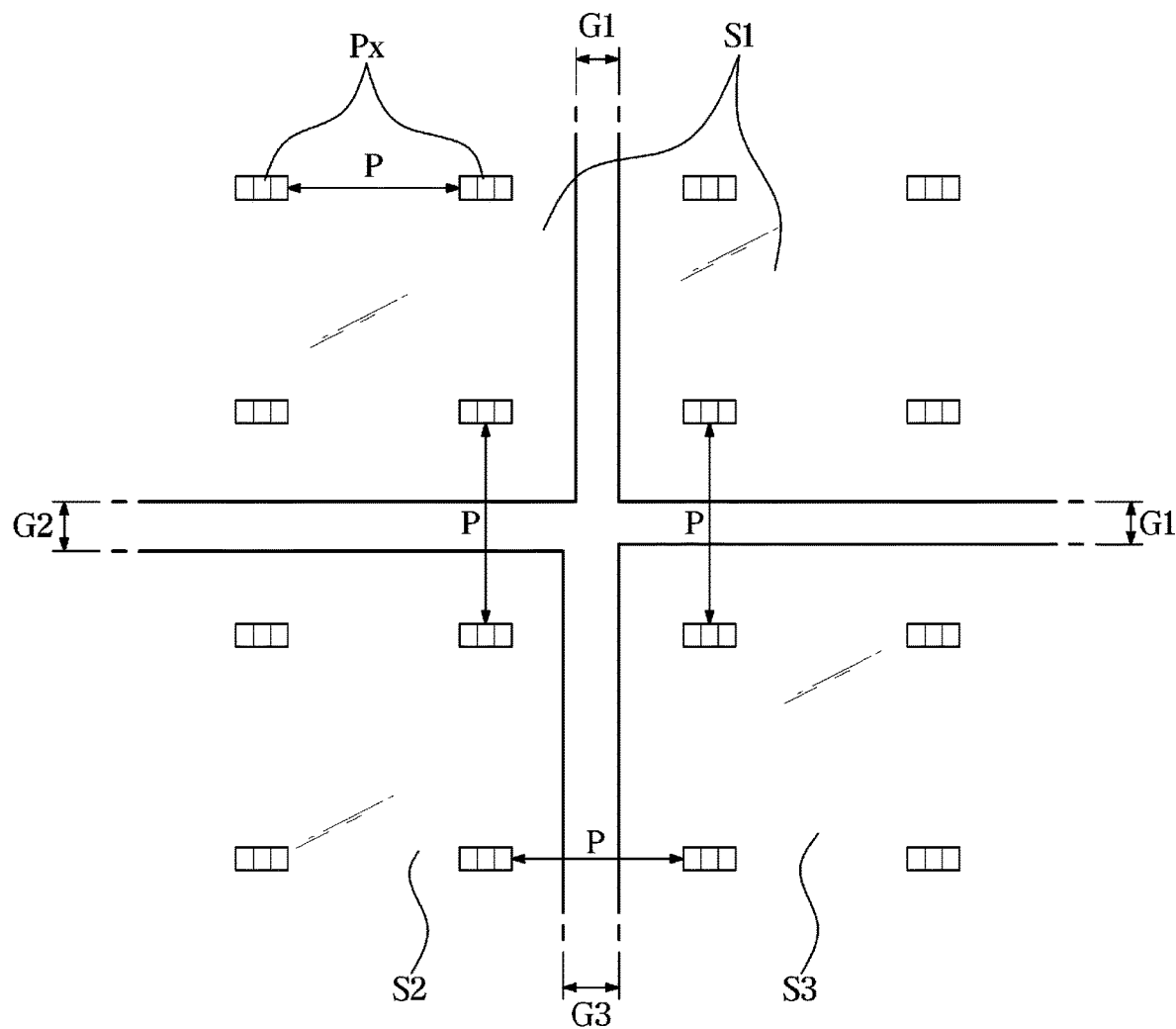
FIG. 5 is a view illustrating a state in which a typical plurality of display modules is tiled.

With reference to FIGS. 3-5, the adhesive layer 120 may include a first region 121 disposed on a gap G formed between the plurality of display modules 30A-30P with respect to a direction to which the mounting surface 41 faces, and a second region 122 disposed on the mounting surface 41.

As described above, in the display apparatus 1, the plurality of display modules 30A-30P is tiled. At this time, the gap G may be formed between the plurality of display modules 30A-30P.

The adhesive layer 120 may be disposed on the plurality of display modules 30A-30P, and thus a part of the adhesive layer 120 may be disposed on the gap G. As mentioned above, in the adhesive layer 120, a region disposed on the gap G is the first region 121, and a region provided to allow the mounting surface 41 to come into contact with the cover layer 110 is the second region 122. The first region 121 and the second region 122 may be distinguished based on the gap G.

The plurality of display modules 30A-30P may further include a black matrix 80 formed between the plurality of inorganic light emitting diodes 50.

The black matrix 80 may perform a function of supplementing the light absorbing layer 60 formed entirely on the mounting surface 41 side of the substrate 40. That is, the black matrix 80 may absorb external light and make the substrate 40 appear black, thereby improving the contrast of the screen.

It is appropriate that the black matrix 80 has a black color.

According to an embodiment, the black matrix 80 may be formed to be disposed among pixels formed by a series of the red light emitting diode 51, the green light emitting diode 52, and the blue light emitting diode 53. However, according to some embodiments, the black matrix 80 may be more finely formed to divide each of the inorganic light emitting diodes 50 (e.g. the red light emitting diode 51, the green light emitting diode 52, and the blue light emitting diode 53) corresponding to a sub-pixel.

The black matrix 80 may be formed in a lattice shape having a horizontal pattern and a vertical pattern so as to be disposed between pixels.

The black matrix 80 may be formed by applying a light-absorbing ink on the anisotropic conductive layer 70 through an ink-jet process and curing the light-absorbing ink or by coating the anisotropic conductive layer 70 with a light-absorbing film.

That is, in the anisotropic conductive layer 70 entirely formed on the mounting surface 41, a black matrix may be formed in a space, in which the plurality of inorganic light emitting diodes 50 is not mounted, between the plurality of inorganic light emitting diodes 50.

As mentioned above, as for the display apparatus 1, the gap G may be formed between the plurality of display modules 30A-30P when the plurality of display modules 30A-30P is tiled. In comparative embodiments with the gap G, light may be diffusely reflected in the gap G and thus heterogeneity may occur and the image quality may deteriorate. In addition, in the comparative embodiments, a seam may be visible due to the gap G of the plurality of display modules 30A-30P, which may cause the occurrence of the heterogeneity, and the deterioration of the image quality.

As described above, the black matrix 80 may be disposed between the plurality of inorganic light emitting diodes 50 constituting the pixel, but a component configured to absorb external light may not be provided in the gap G and thus the heterogeneity may occur and image quality may deteriorate in comparative embodiments.

According to a conventional technique for implementing a large screen through tiling, after a display panel is formed by forming an encapsulation layer, which is configured to protect a plurality of inorganic light emitting diodes, for each display module, the plurality of display panels is tiled to implement a large screen. Therefore, a gap is formed between the encapsulation layers adjacent to each other, and thus seam recognition, heterogeneity, and deterioration in image quality occur due to the gap between the encapsulation layers. Therefore, a side light absorbing layer is formed on a side surface of the encapsulation layer to alleviate the seam recognition, the heterogeneity, and the deterioration in image quality. However, this process is difficult and complicated.

Therefore, conventionally, in order to alleviate this difficulty, a plurality of display modules is disposed adjacent to each other, and then a process of forming a black matrix and a light absorption pattern, which is disposed on the gap so as to absorb light irradiated to the gap, is performed on the entire mounting surfaces of the plurality of display modules. After the process, a single encapsulation layer is integrally formed thereon.

Alternatively, the light absorption pattern is patterned on the optical clear adhesive layer or the cover glass forming the encapsulation layer, and the plurality of display modules is tiled according to the light absorption pattern so as to proceed with a process in which the light absorption pattern is disposed in the gap between the plurality of display modules.

However, the process of forming the light absorption pattern in the fine gaps is also very difficult and complicated, and thus it is difficult to precisely arrange the light absorption pattern in the gaps, which may still cause a difficulty that manufacturing reliability is deteriorated.

In addition, when patterning the light absorption pattern on the optical clear adhesive layer or the cover glass, the difficulty of the process of forming the light absorption pattern may be lowered, but it means that the light absorption pattern is formed on the encapsulation layer in advance before tiling the plurality of display modules. Therefore, it may be difficult to align the plurality of display modules according to the light absorption pattern due to an error in the gap generated when tiling the plurality of display modules.

For example, as illustrated in FIG. 5, the plurality of display modules may be arranged such that pitches P between pixels Px mounted on each display module are formed in all directions equally.

At this time, in the process of forming the substrate of the display module, due to manufacturing errors, all the substrates may not be formed to the same size, and some substrates s2 and s3 may have different sizes.

Therefore, when the pitches P between the pixels Px are all uniformly formed, the sizes of the gaps G1, G2, and G3 formed between the plurality of display modules may not be the same.

Accordingly, when the light absorption pattern, which may be disposed in the gap, is formed before tiling of the plurality of display modules as described above, the light absorption pattern may not be disposed on all the gaps.

That is, when it is assumed that a gap, which is formed when the substrate s1 is manufactured by the designed value, is G1, gaps G2 or G3, which is greater than the gap G1, may be formed, or a gap less than the gap G1 may be formed due to manufacturing error of the substrate s2 and s3.

At this time, the light absorption pattern may be formed to have a width corresponding to a width of the gap G1 based on the designed value. The gaps G2 and G3 may have a larger width than the gap G1, and the gaps G2 and G3 may be disposed on the outside of the light absorption pattern.

Therefore, the seam recognition, the heterogeneity, and the deterioration in image quality may occur in the gaps G2 and G3.

Accordingly, the display apparatus 1 according to an embodiment of the disclosure may include the adhesive layer 120 configured to absorb light irradiated to each of the gap G, which may be formed during tiling the plurality of display modules 30A-30P, so as to prevent the deterioration in image quality that may occur in the gap G.

Particularly, the first region 121 of the adhesive layer 120 disposed on the gap G may be configured to absorb external light, and thus the first region 121 may absorb light irradiated to the gap G. Therefore, it is possible to alleviate the seam recognition, the heterogeneity, and the deterioration in image quality which may occur in the gap G in comparative examples.

As mentioned above, the adhesive layer 120 may be formed as a single piece and adhere to the plurality of display modules 30A-30P. Accordingly, with reference to FIG. 3, the first region 121 of the adhesive layer 120 may be disposed on each of the gap G formed between the plurality of display modules 30A-30P.

The first region 121 may be formed of a black-based material that sufficiently absorbs light to maximize the light absorption effect. It is appropriate that the first region 121 is provided to have a color corresponding to the black matrix 80.

As mentioned above, the adhesive layer 120 may be formed of a transparent material but the first region 121 may be provided to include a black material. Therefore, external light moving toward the gap G may be absorbed by the first region 121.

The adhesive layer 120 may include a photosensitive material which may be colored to black. The first region 121 and the second region 122 may include the same material and have the same color. The first region 121 and the second region 122 may include the same photosensitive material.

However, in the manufacturing process of the display apparatus 1, only the first region 121 may be colored to the black color due to the irradiation of the external light, which has a wavelength other than the wavelength of visible light, such as ultraviolet (UV) light. This will be described later in detail.

As for the adhesive layer 120 disposed on the entirety of the mounting surface 41 and the gap G of the plurality of display modules 30A-30P, the first region 121 disposed on the gap G absorbs external light. The second region 122 is disposed on the mounting surface 41 and provided to transmit the external light while transmitting light irradiated from the plurality of display modules 30A-30P. Therefore, without an additional component arranged in gap G, it is possible to alleviate the heterogeneity, and the deterioration in image quality which may occur in the gap G.

That is, a part of the adhesive layer 120, itself, forming the encapsulation layer 100 may be changed to a light absorbing structure configured to absorb external light flowing into the gap G, and thus a process of separately forming or arranging the light absorbing structure may be eliminated. As a result, manufacturing efficiency of the display apparatus 1 may increase. In addition, the first region 121 may be disposed on each of the gap G, thereby improving the performance of the display apparatus 1.

Hereinafter a process of changing the first region 121 to a state of absorbing external light will be described in detail.

Figure 6:
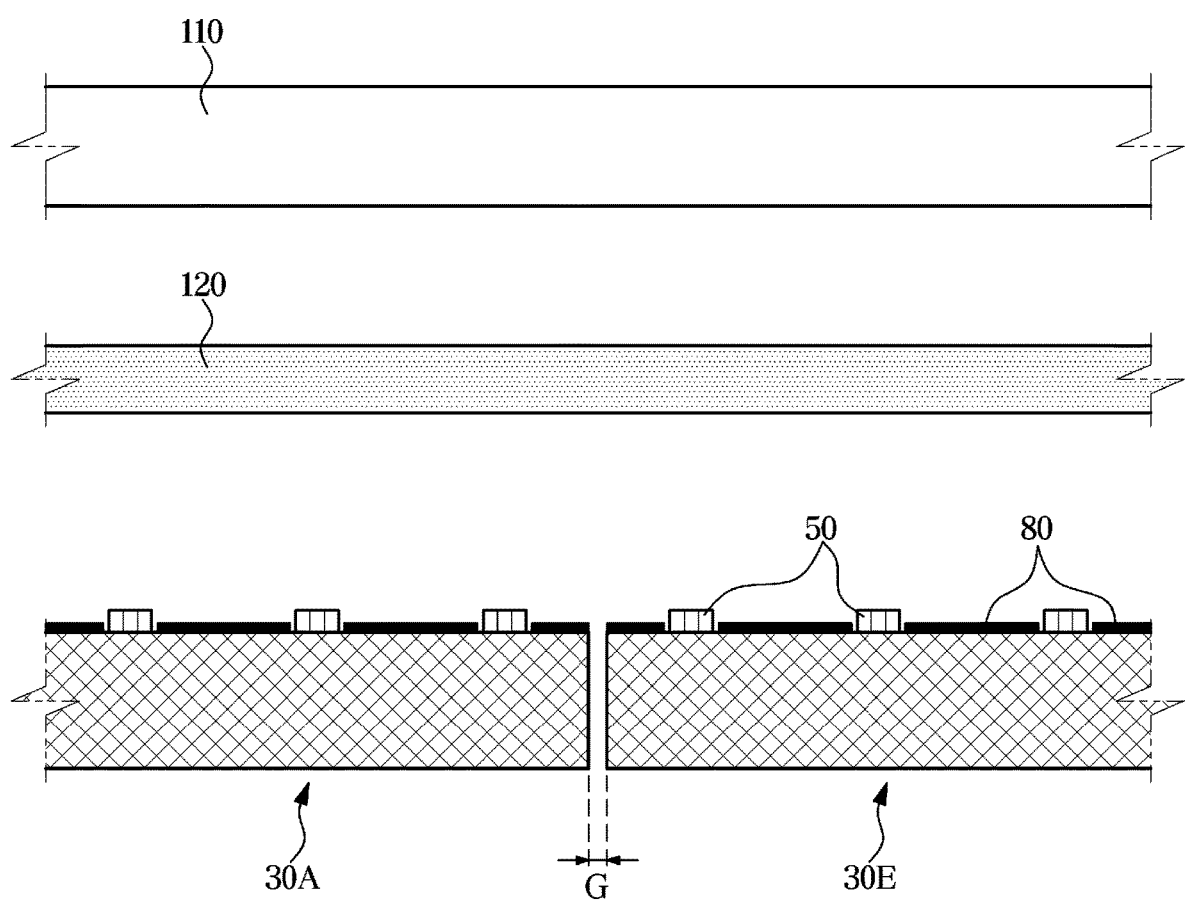
FIG. 6 is a view illustrating a state before a plurality of display modules and an encapsulation layer of the display apparatus of FIG. 1A are coupled.
Figure 7:
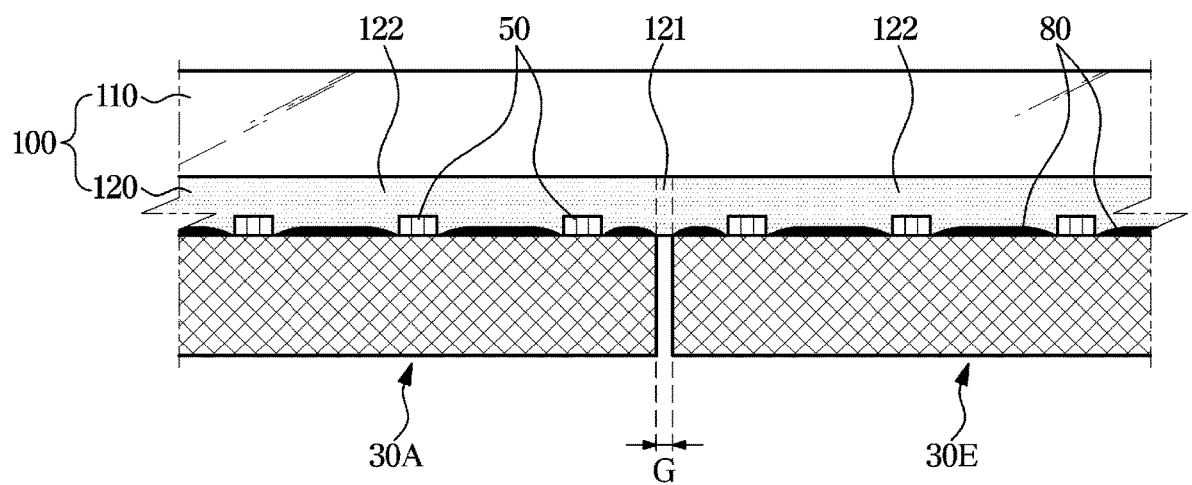
FIG. 7 is a view illustrating a state after the plurality of display modules and the encapsulation layer of the display apparatus of FIG. 6 are coupled.
Figure 8:
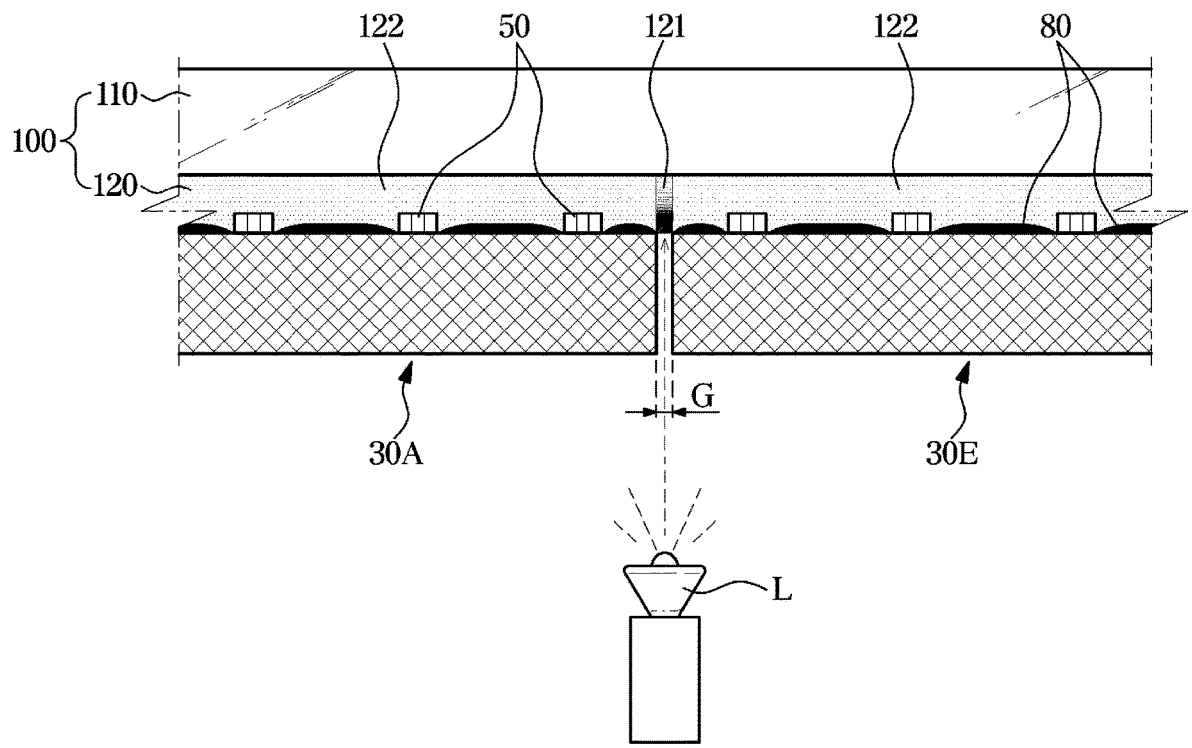
FIG. 8 is a view illustrating a state in which a light absorption region is formed in the display apparatus of FIG. 6.

FIG. 6 is a view illustrating a state before a plurality of display modules and an encapsulation layer of the display apparatus of FIG. 1A are coupled, FIG. 7 is a view illustrating a state after the plurality of display modules and the encapsulation layer of the display apparatus of FIG. 6 are coupled, and FIG. 8 is a view illustrating a state in which a light absorption region is formed in the display apparatus of FIG. 6.

As illustrated in FIG. 6, the cover layer 110 and the adhesive layer 120 may be disposed on the plurality of display modules 30A-30P in a state in which the plurality of display modules 30A-30P is tiled.

As mentioned above, the adhesive layer 120 may be provided as a clear adhesive film type including a photosensitive material.

The adhesive layer 120 may bond the cover layer 110 to the mounting surface 41 of the plurality of display modules 30A-30P. The black matrix 80 may be first formed on the anisotropic conductive layer 70 before the adhesive layer 120 bonds the cover layer 110 to the plurality of display modules 30A-30P.

With reference to FIG. 7, the cover layer 110 and the plurality of display modules 30A-30P may be pressed at a high temperature and then the adhesive layer 120 may bond the cover layer 110 to the plurality of display modules 30A-30P.

When the cover layer 110, the adhesive layer 120, and the plurality of display modules 30A-30P are overlapped, the adhesive layer 120 may be partitioned into the first region 121 and the second region 122 by the gap G formed between the plurality of display modules 30A-30P.

In this case, the first region 121 and the second region 122 may be provided to have the same material and the same color. As described above, with respect to the direction to which the mounting surface 41 faces, the first region 121 may be disposed in each of the gap G, and the second region 122 may be transparent and disposed on the mounting surface 41 of the plurality of display modules 30A-30P.

As illustrated in FIG. 8, the external light L may be irradiated toward the plurality of display modules 30A-30P from a direction opposite to the direction in which the mounting surface 41 faces.

The external light L may be light having a wavelength outside the wavelength of visible light, such ultraviolet (UV) light, and particularly, the external light L may be limited to light having a wavelength greater or less than the wavelength of visible light irradiated from the plurality of inorganic light emitting diodes 50.

When the external light L is irradiated toward the plurality of display modules 30A-30P from the opposite direction of the direction to which the mounting surface 41 faces, the external light L may pass through the gap G to reach the first region 121.

Accordingly, as the external light L is irradiated only to the first region 121, the photosensitive material contained in the first region 121 may generate a change in physical properties and thus only the first region 121 may be colored to a dark color. That is, it is appropriate that the first region 121 is colored to a black color.

The first region 121 of the adhesive layer 1230 is a light absorbing region formed by undergoing the photosensitive reaction based on an external light L.

When the second region 122 is disposed on the mounting surface 41 of the plurality of display modules 30A-30P with respect to the direction to which the mounting surface 41 faces and when the external light L is irradiated to the plurality of display modules 30A-30P from the opposite direction of the direction to which the mounting surface 41 faces, the external light L may not reach the second region 122 due to the substrate 40 of the plurality of display modules 30A-30P.

Accordingly, the photosensitive material contained in the second region 122 may maintain an original transparent color without changing physical properties due to the external light L.

That is, in the adhesive layer 120, the first region 121 disposed on the gap G may be changed to a region configured to absorb light and the second region 122 disposed on the mounting surface 41 of the plurality of display modules 30A-30P may be a region configured to transmit light.

The display apparatus 1 according to an embodiment of the disclosure may not include an additional light absorbing component configured to absorb light irradiated to the gap G because the first region 121 configured to absorb light is formed as a part of the adhesive layer 120.

Because it is possible to simply change the first region 121 into a region configured to absorb the external light through a process of irradiating the external light L to the plurality of display modules 30A-30P from the opposite direction of the direction to which the mounting surface 41 faces, it is possible to reduce a process of installing or forming a light absorbing component, thereby improving the efficiency of assembly of the display apparatus 1.

The display apparatus 1 according to an embodiment of the disclosure is provided in such a way that the encapsulation layer 100 is formed on an entirety of the display modules 30A-30P constituting the display panel 20, and thus a gap may not occur in the encapsulation layer 100. Therefore, it is possible to more easily and efficiently implement a seamless effect when constructing a large screen through tiling.

In addition, by integrally encapsulating the plurality of display modules 30A-30P, it is possible to achieve the effect of assembling each other through only process of encapsulating the plurality of display modules 30A-30P.

Further, because the conventional process of forming a light absorption pattern configured to absorb light irradiated in the gap with the black matrix before forming the encapsulation layer 100 is eliminated, the efficiency of the process may be increased.

When a light absorption pattern of a comparative example and the gap G are disposed, an error in the position between the light absorption pattern and the gap G, which may be caused by an error in the gap G, may occur. In contrast, embodiments of the disclosure may avoid such error in the position, and the first region 121 configured to absorb light may be provided to always be arranged above the gap G, thereby increasing the reliability of the performance of the display apparatus 1.

Further, in the conventional manner, a light absorption pattern of a comparative example is patterned on a cover layer or an adhesive layer. At this time, a height difference occurs between a plurality of inorganic light emitting diodes and the light absorption pattern in a direction of a mounting surface, and some of the light beams irradiated from the plurality of inorganic light emitting diodes are blocked by the light absorption pattern, which may cause the degradation of the performance of the display apparatus 1.

However, according to an embodiment of the disclosure, a part of the adhesive layer 120 itself may absorb light, and thus it is possible to minimize blocking of the light irradiated from the plurality of inorganic light emitting diodes 50. Therefore, it is possible to improve the performance of the display apparatus 1.

Hereinafter a first region 121' and a second region 122' of an adhesive layer 120 of a display apparatus 1 according to another embodiment of the disclosure will be described in detail. Configurations other than the first region 121' and the second region 122' described below are the same as those of the display apparatus 1 according to an embodiment of the disclosure described above, and thus further description thereof will be omitted.

Figure 9:
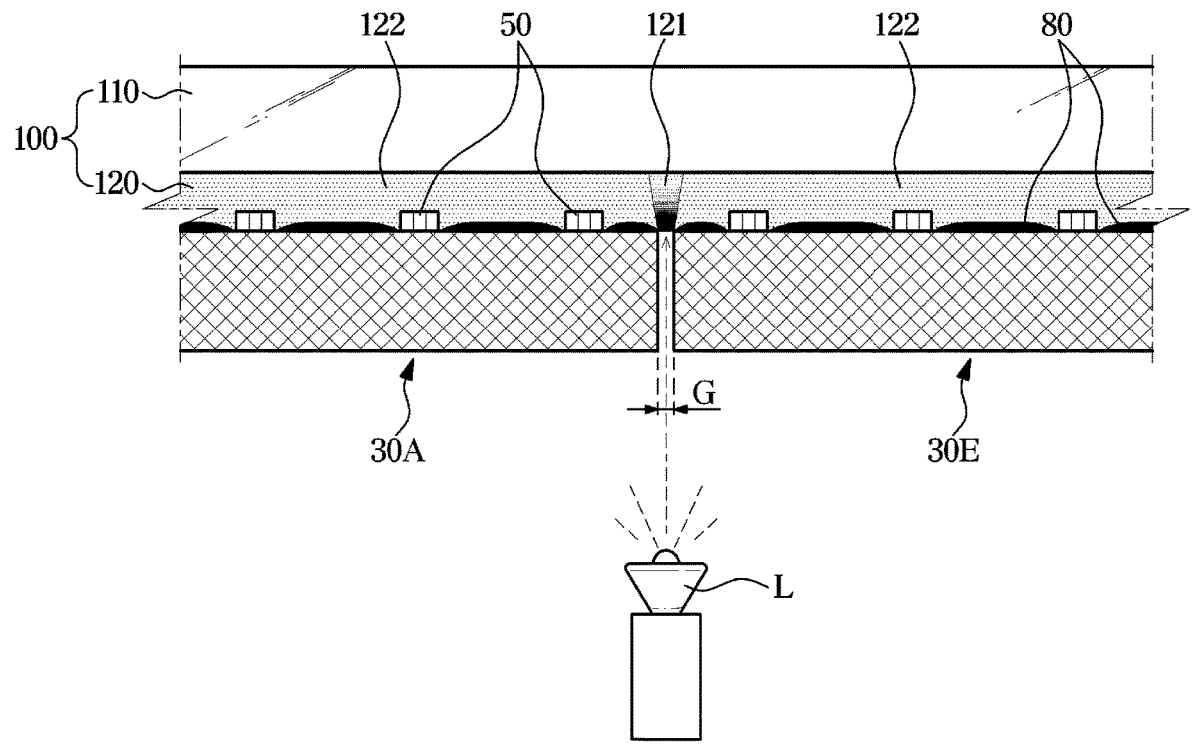
FIG. 9 is a view illustrating a state in which a light absorption region is formed in a display apparatus according to another embodiment of the disclosure.

FIG. 9 is a view illustrating a state in which a light absorption region is formed in a display apparatus according to another embodiment of the disclosure.

As illustrated in FIG. 9, a cross section of the first region 121' may be provided in a trapezoidal shape extending in a direction to which a mounting surface 41 faces.

The first region 121' according to an embodiment of the disclosure may be disposed only in the gap G, but is not limited thereto, and at least a part of the first region 121' may be disposed on the outside of the gap G with respect to the direction to which the mounting surface 41 faces.

The reason of arranging at least a part of the first region 121' on the outside of the gap G is because some of light beams irradiated toward the substrate 40 from an opposite side of the mounting surface 41 may be transmitted to the outside of the gap G during a process of forming the first region 121'.

That is, according to the process of forming the first region 121', a part of the first region 121' may be disposed on the outside of the gap G, as illustrated in another embodiment of the disclosure, or the first region 121 may be disposed only in the gap G as illustrated in an embodiment of the disclosure (refer to the first region 121 of FIG. 8).

Alternatively, at least a part of the second region may be disposed in the gap G.

The first region 121 according to other embodiments of the disclosure described below will be described as an example of the first region 121 provided to be disposed only in the gap G, but is not limited thereto. The first region 121' according to another embodiment may be applied to other embodiments of the disclosure described later.

Hereinafter a manufacturing method of a display apparatus according to an embodiment of the disclosure will be briefly described with reference to FIGS. 1 to 8.

Figure 10:
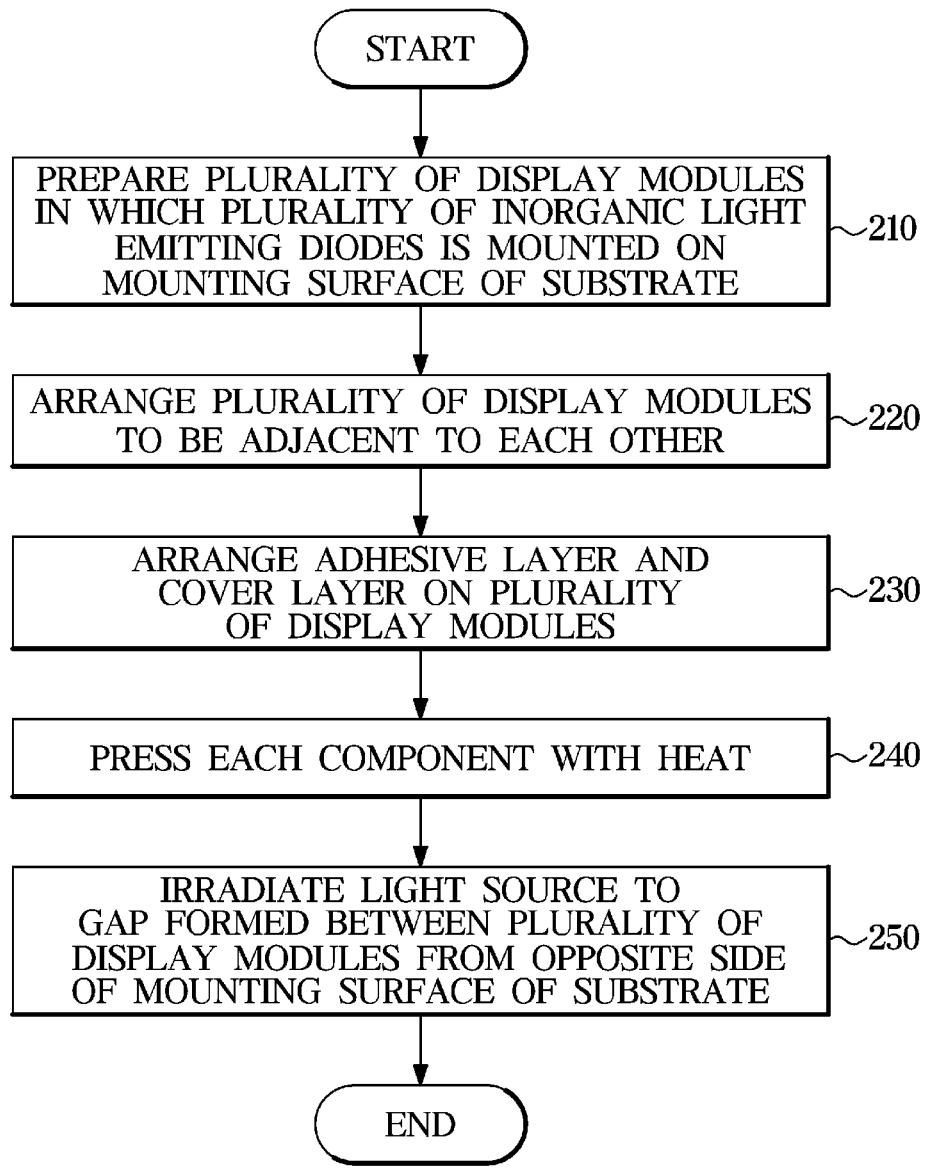
FIG. 10 is a flow chart illustrating a method of manufacturing a display apparatus according to an embodiment of the disclosure.

FIG. 10 is a flow chart illustrating a method of manufacturing a display apparatus according to an embodiment of the disclosure.

The plurality of display modules 30A-30P is prepared (210). The plurality of display modules 30A-30P may be formed by mounting a plurality of inorganic light emitting diodes 50 on a mounting surface 41 of a substrate 40, respectively. To improve contrast, the substrate 40 may include a light absorbing layer 60. The substrate 40 may include an anisotropic conductive layer 70 to easily connect the plurality of inorganic light emitting diodes 50 to the substrate 40.

A black matrix 80 may be formed on the anisotropic conductive layer 70 of the plurality of display modules 30A-30P.

The plurality of display modules 30A-30P may be disposed adjacent to each other (220). At this time, the plurality of display modules 30A-30P may be fixed through a jig. The plurality of display modules 30A-30P may be arranged in a matrix form of M*N.

The adhesive layer 120 and the cover layer 110 may be disposed on the plurality of display modules 30A-30P in a direction to which the mounting surface 41 faces (230).

At this time, after the plurality of display modules 30A-30P is arranged adjacent to each other, the adhesive layer 120 and the cover layer 110 may be disposed on the plurality of display modules 30A-30P. Alternatively, after the cover layer 110 and the adhesive layer 120 are arranged, the plurality of display modules 30A-30P may be disposed on the adhesive layer 120 and then the plurality of display modules 30A-30P may be disposed adjacent to each other.

Each component (e.g. the cover layer 110, the adhesive layer 120, and the plurality of display modules 30A-30P) may be applied with heat and pressed in one direction or the other direction (240). For example, after fixing the cover layer 110, the plurality of display modules 30A-30P may be pressed in a direction in which the cover layer 110 is disposed. Alternatively, after fixing the plurality of display modules 30A-30P, the cover layer 110 may be pressed in a direction in which the plurality of display modules 30A-30P is disposed.

Accordingly, the adhesive layer 120 may be provided to bond the cover layer 110 to the plurality of display modules 30A-30P.

The external light L may be irradiated toward the plurality of display modules 30A-30P from the opposite direction of the direction to which the mounting surface 41 faces (250). The first region 121 of the adhesive layer 120 disposed in the gap G may generate a change in physical properties by the external light L such that the first region 121 is changed into a light absorption region configured to absorb light.

Hereinafter a block film 111 and a block film 112 of a display apparatus 1' according to another embodiment of the disclosure will be described. Configurations other than the block film 111 and the block film 112 described below are the same as those of the display apparatus 1 according to an embodiment of the disclosure, and thus further description thereof will be omitted.

Figure 11:
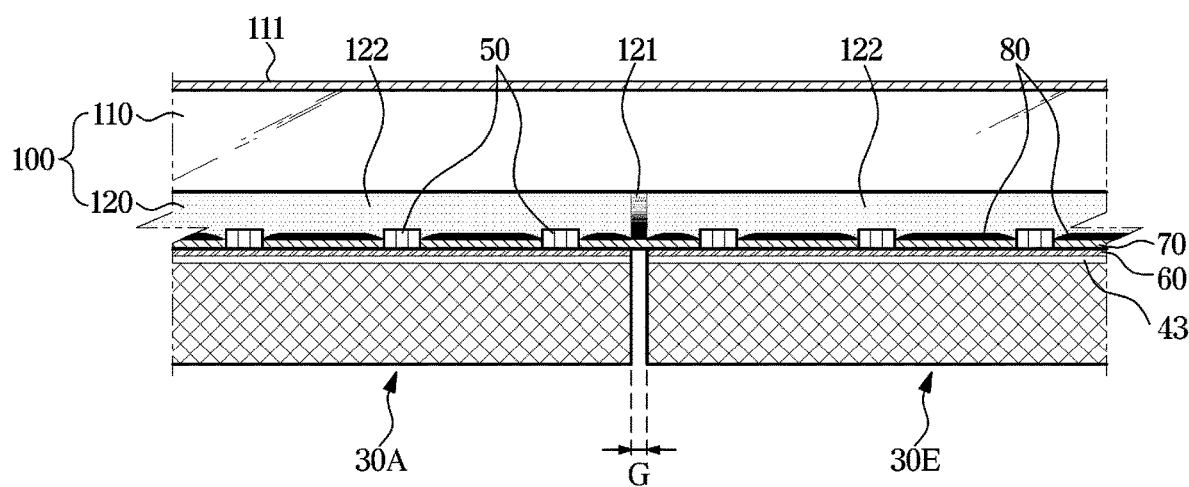
FIG. 11 is a cross-sectional view of some components of a display apparatus according to another embodiment of the disclosure.
Figure 12A:
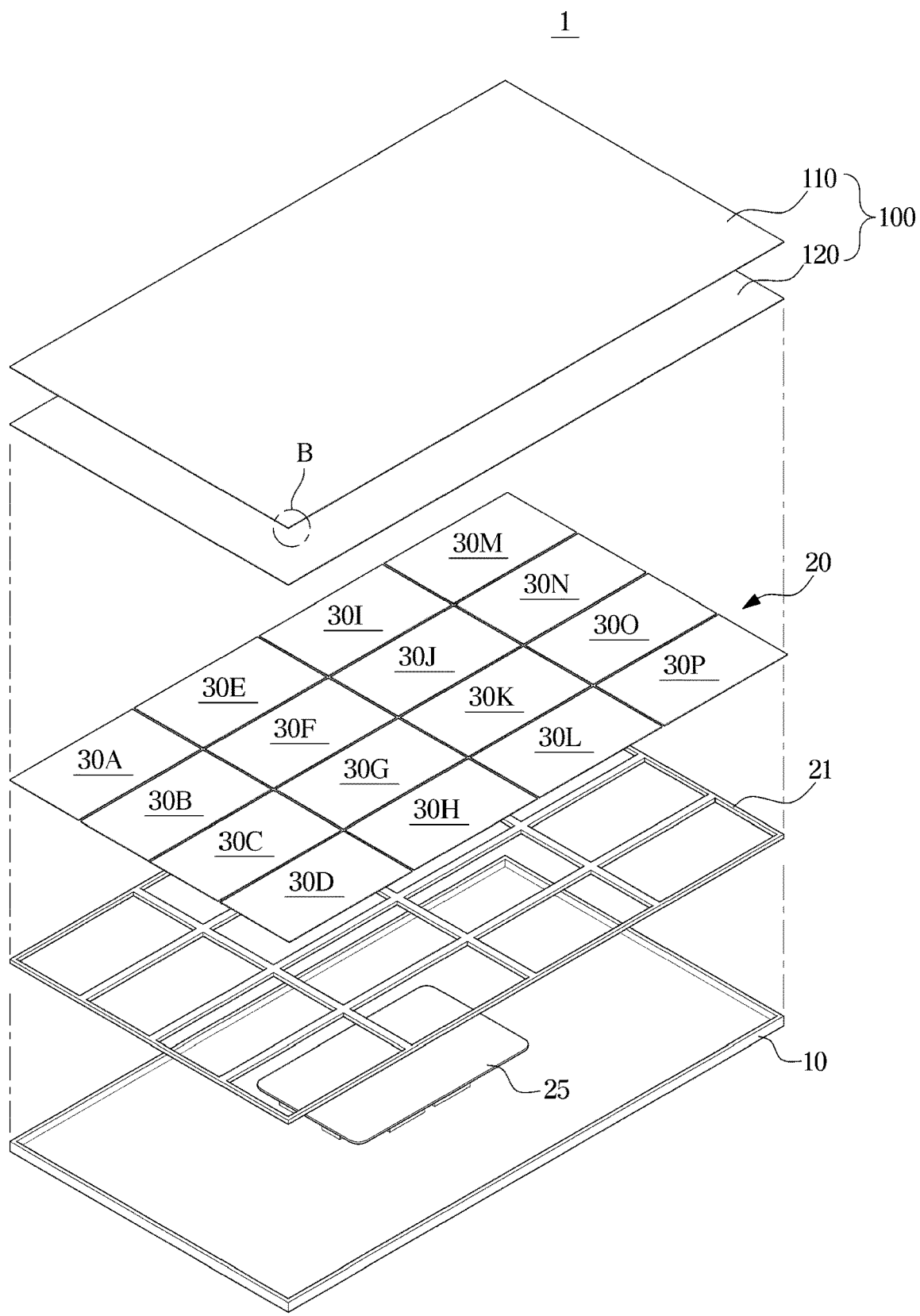
FIG. 12A is an exploded view of main components of a display apparatus according to yet another embodiment of the disclosure.
Figure 12B:
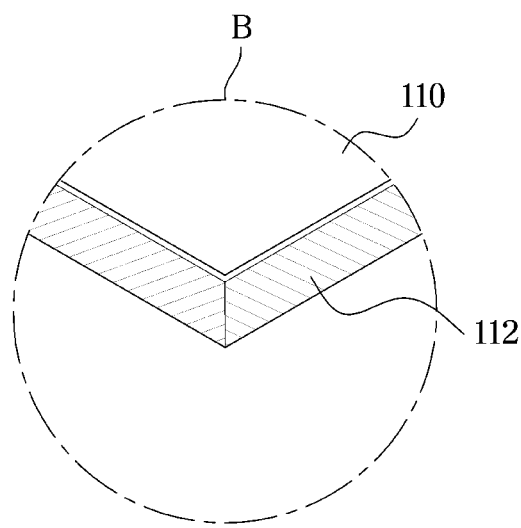
FIG. 12B is a magnified view of a portion of the main components of FIG. 12A.

FIG. 11 is a cross-sectional view of some components of a display apparatus according to another embodiment of the disclosure, FIG. 12A is an exploded view of main components of a display apparatus according to another embodiment of the disclosure, and FIG. 12B is a magnified view of a portion B of the main components of FIG. 12A.

As mentioned above, the adhesive layer 120 may include a photosensitive material that reacts to a light source having a wavelength greater or less than the wavelength range of visible light irradiated from the plurality of inorganic light emitting diodes 50 that is ultraviolet (UV) light having a wavelength outside the wavelength range of visible light.

Accordingly, in the adhesive layer 120, change in physical properties thereof, which is caused by light irradiated from the plurality of inorganic light emitting diodes 50, may not occur and the second region 122 may maintain a transparent color. However, light irradiated from the sun includes various ranges of wavelengths. For example, there is a difficulty in which when ultraviolet light irradiated from the sun passes through the cover layer 110 and reaches the adhesive layer 120, the photosensitive material contained in the second region 122 as well as the first region 121 may be colored.

In order to alleviate this difficulty, the cover layer 110 may further include the block film 111 and the block film 112 configured to prevent sunlight from being irradiated to the second region 122.

The block film 111 and the block film 112 may transmit light having a wavelength range of visible light, and may limit transmission of light having a wavelength range greater or less than the wavelength range of visible light.

Particularly, the block film 111 and the block film 112 may transmit only light having a wavelength range in which physical properties of the photosensitive material does not change when light is irradiated to the photosensitive material of the adhesive layer 120, and the block film 111 and the block film 112 may block light having a wavelength range in which physical properties of the photosensitive material changes.

As illustrated in FIG. 11, the block film 111 may be attached to a front surface of the cover layer 110.

Alternatively or additionally, as illustrated in FIG. 12A, the block film 112 may be attached to a side surface of the cover layer 110.

Further, the block film 111 and the block film 112 illustrated in FIGS. 11 and 12 may be attached to the cover layer 110.

Hereinafter a display apparatus according to another embodiment of the disclosure will be described. Configurations other than an encapsulation layer 100 and black matrixes 80' and 80" described below are the same as those of the display apparatus 1 according to an embodiment of the disclosure described above, and thus further description thereof will be omitted.

Figure 13:
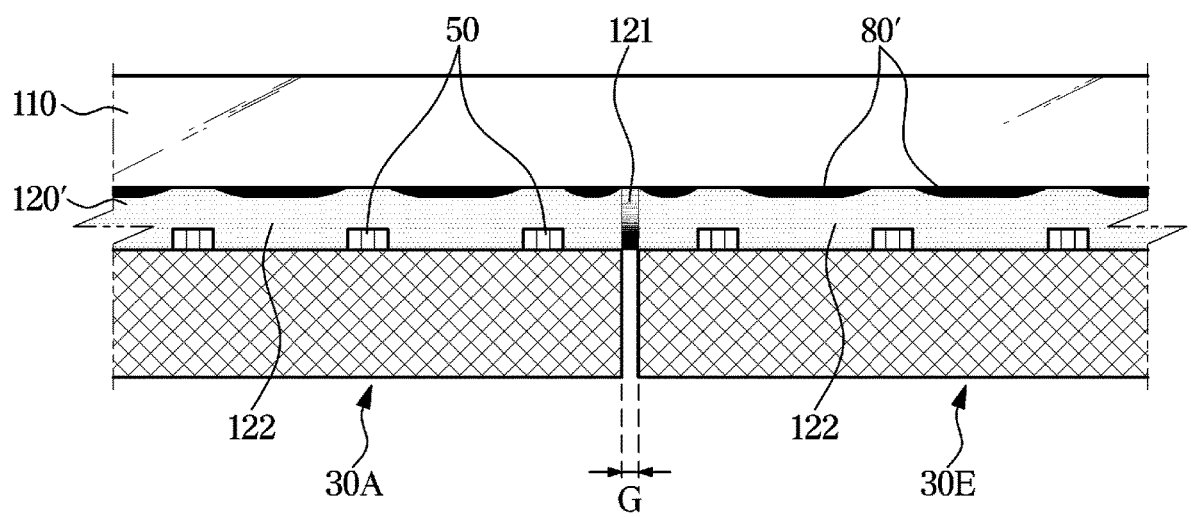
FIG. 13 is a cross-sectional view of some components of a display apparatus according to another embodiment of the disclosure.
Figure 14:
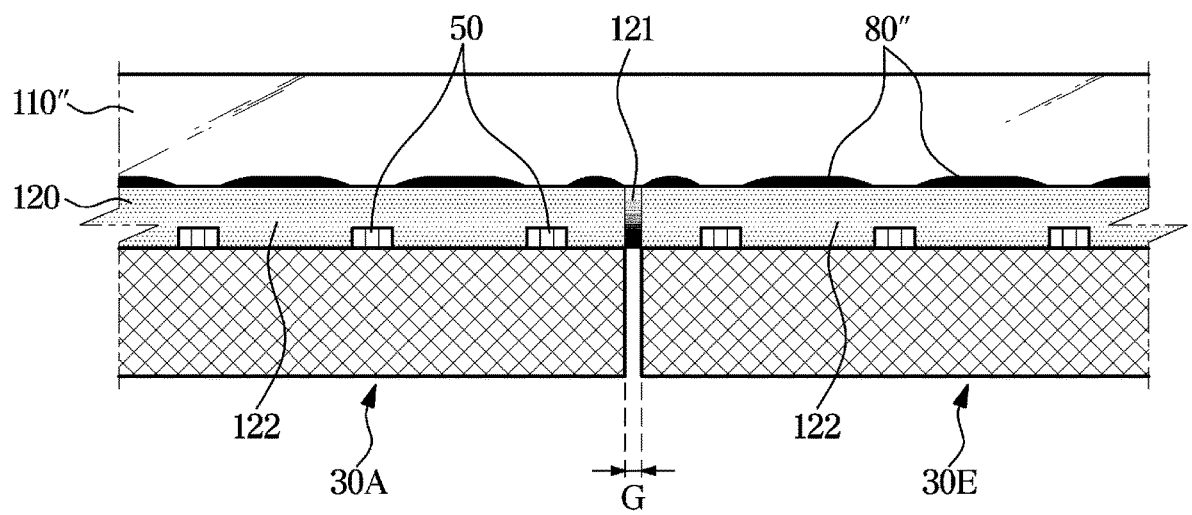
FIG. 14 is a cross-sectional view of some components of a display apparatus according to another embodiment of the disclosure.

FIG. 13 is a cross-sectional view of some components of a display apparatus according to another embodiment of the disclosure and FIG. 14 is a cross-sectional view of some components of a display apparatus according to another embodiment of the disclosure.

As shown in FIG. 13, the black matrix 80' may be formed on an adhesive layer 120'. That is, in contrast to the black matrix 80 according to an embodiment of the disclosure that is formed on the anisotropic conductive layer 70, the black matrix 80' may be formed on one surface of an adhesive layer 120' according to another embodiment of the disclosure.

At this time, a plurality of display modules 30A-30P may be tiled based on the black matrix 80' formed on the adhesive layer 120'.

As illustrated in FIG. 14, the black matrix 80" may be formed on a cover layer 110". That is, in contrast to the black matrix 80 according to an embodiment of the disclosure that is formed on the anisotropic conductive layer 70, the black matrix 80" may be formed on one surface of the cover layer 110" according to another embodiment of the disclosure.

At this time, the plurality of display modules 30A-30P may be tiled based on the black matrix 80" formed on the cover layer 110".

As illustrated in FIGS. 13 to 14, the black matrix 80' and 80" corresponding to a component different from the first region 121 configured to absorb light may be formed on the substrate 40 of the plurality of display modules 30A-30P or formed as an additional component in the cover layer 110" or the adhesive layer 120'.

However, the first region 121 configured to absorb light irradiated through the gap G may be provided as one region of the adhesive layers 120 and 120', and may be formed as a separate component from the black matrix 80' and 80".

Hereinafter a display apparatus according to another embodiment of the disclosure will be described. Configurations other than an adhesive layer 150 described below are the same as those of the display apparatus 1 according to an embodiment of the disclosure described above, and thus the description thereof will be omitted.

Figure 15:
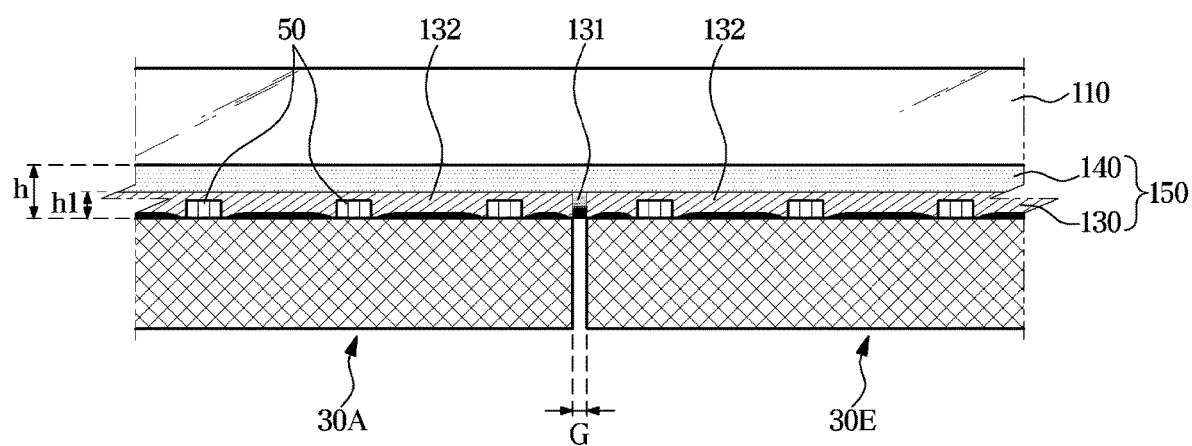
FIG. 15 is a cross-sectional view of some components of a display apparatus according to another embodiment of the disclosure.

FIG. 15 is a cross-sectional view of some components of a display apparatus according to another embodiment of the disclosure.

An adhesive layer may be provided to have a height greater than a predetermined height in a direction to which the mounting surface faces due to sufficiently filling a gap that may be formed between the adhesive layer and the plurality of inorganic light emitting diodes when the adhesive layer bonds the substrate and the cover glass.

Particularly, the mounting surface may be uneven due to the plurality of inorganic light emitting diodes mounted on the mounting surface, and thus the adhesive layer may be required to have a height greater than a predetermined height to fill the unevenness of the mounting surface, which is formed by the plurality of inorganic light emitting diodes, without a void that may occur between the plurality of inorganic light emitting diodes and the mounting surface.

That is, in order to completely fill the mounting surface and the cover glass without voids between the mounting surface and the cover glass and without bubbles in the adhesive layer caused by the unevenness, the adhesive layer may be required to have a predetermined height.

When it is assumed that a total height of the adhesive layer 150 to the direction to which the mounting surface 41 faces is h, the first region may be formed to have a height as much as the height h of the adhesive layer 150.

As described above, the height h of the adhesive layer 150 is required to have a value equal to or greater than a certain height but the height of the first region may be formed to have the height same as the height h of the adhesive layer 150. Accordingly, the height of the first region may be higher than necessary and thus the first region may be disposed on an irradiation radius of the plurality of inorganic light emitting diodes, thereby reducing the efficiency of the display apparatus.

In order to alleviate such a difficulty, as for the display apparatus according to another embodiment of the disclosure, the adhesive layer 150 may include a first layer 130 disposed adjacent to the mounting surface 41, and a second layer 140 disposed on the first layer 130.

The first layer 130 may include a photosensitive material. The second layer 140 may not include a photosensitive material. That is, both the first layer 130 and the second layer 140 are formed of a transparent optical adhesive material, but only the first layer 130 may include a photosensitive material.

The first layer 130 may be divided into a first region 131 disposed on the gap G in a direction to which the mounting surface 41 faces and a second region 132 disposed on the mounting surface 41.

When the external light L is irradiated toward the plurality of display modules 30A-30P from a direction opposite to the direction to which the mounting surface 41 faces, the external light L may pass through the gap G and reach the first region 131.

Accordingly, as the external light L is irradiated only to the first region 131, physical properties of the photosensitive material contained in the first region 131 may change and thus only the first region 131 may be colored to a dark color. That is, it is appropriate that the first region 131 is colored to a black color.

The external light L may be irradiated to the second layer 140 because a part of the second layer 140 is disposed in the gap G in the direction to which the mounting surface 41 faces. However, the second layer 140 may not include a photosensitive material as mentioned above, and thus the change in physical properties may not occur in the second layer 140.

Therefore, the region configured to absorb light may be limited only to the first region 131 of the first layer 130 and the second layer 140 may not include the region configured to absorb light.

A height of the first region 131 configured to absorb light may be a height h1 less than the total height h of the adhesive layer 150.

When the adhesive layer 150 is formed with a single layer containing a photosensitive material without distinction between the first layer 130 and the second layer 140, the height of the region configured to absorb light may be the same as the height h of the adhesive layer 150.

At this time, as described above, some of light beams generated in the inorganic light emitting diode disposed adjacent to the region configured to absorb light may be limited to be irradiated to the outside of the display apparatus by the region configured to absorb light.

However, because the height h1 of the first region 131 of the adhesive layer 150 according to the embodiment of the disclosure is less than the height h of the entirety of the adhesive layer 150, it is possible to minimize the limitation in the irradiation of light generated by the inorganic light emitting diode adjacent to the first region 131.

As mentioned above, the adhesive layer 150 may be formed with the first layer 130 and the second layer 140, thereby improving the performance of the display apparatus.

Hereinafter a display apparatus according to another embodiment of the disclosure will be described. Configurations other than a block layer 47 described below are the same as those of the display apparatus 1 according to an embodiment of the disclosure described above, and thus further description thereof will be omitted.

Figure 16:
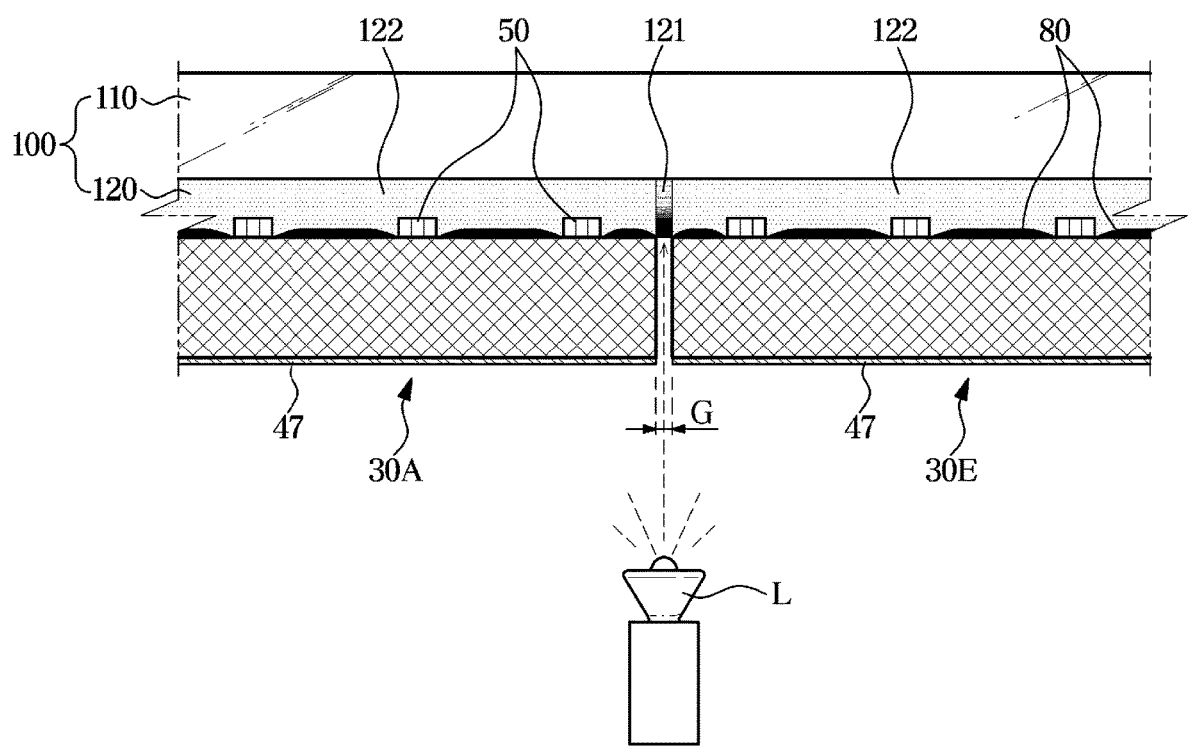
FIG. 16 is a cross-sectional view of some components of a display apparatus according to another embodiment of the disclosure.

FIG. 16 is a cross-sectional view of some components of a display apparatus according to another embodiment of the disclosure.

A substrate 40 of a plurality of display modules 30A-30P may include a block layer 47 disposed on an opposite side from a mounting surface 41.

The block layer 47 may be formed of a material through which a light source L does not pass.

As mentioned above, a base substrate 42 may be provided as a glass material. The glass is a material having high light transmittance and thus some of the light beams irradiated from the light source L may pass through the base substrate 42 and be irradiated to an adhesive layer 120.

At this time, because the adhesive layer 120 includes a photosensitive material in which physical properties thereof is changed by the light source L, the second region 122 may be colored.

It is appropriate that only the first region 121 is colored by the light source L irradiated through the gap G, and thus the block layer 47 may be provided to prevent the second region 122 from being colored caused by the light source L transmitted through the base substrate 42.

The block layer 47 may be arranged toward a direction in which the light source L is irradiated. That is, the block layer 47 may be provided in the direction, in which the light source L is irradiated, so as to cover the base substrate 42.

By the block layer 47, it is possible to prevent the light source L from being irradiated to the second region 122 through the base substrate 42. Accordingly, only the first region 121 may be changed to a region, which is configured to absorb light, by the light source L.

As is apparent from the above description, display apparatuses of the present disclosure may have the seamless effect in which a seam is not visible, because light, which is incident through a gap between display modules adjacent to each other, is absorbed by a light absorption region.

The display apparatuses may more easily and efficiently realize the seamless effect because a part of the adhesive layer forms a light absorption region after the plurality of display modules is assembled.

Although a few embodiments of the disclosure have been shown and described, it would be appreciated by those skilled in the art that changes may be made in these embodiments without departing from the principles and spirit of the disclosure.

What is claimed is:

1. A display apparatus comprising:
a plurality of display modules, each of the plurality of display modules comprising a substrate and a plurality of inorganic light emitting diodes mounted on a mounting surface of the substrate;
a cover layer configured to cover the mounting surface of each of the plurality of display modules; and
an adhesive layer arranged between the cover layer and the mounting surface of each of the plurality of display modules to cause the cover layer to adhere to the mounting surface of each of the plurality of display modules,
wherein the adhesive layer comprises a first region, disposed on a gap formed between the plurality of display modules, and a second region disposed on the mounting surface of each of the plurality of display modules, and
wherein the adhesive layer includes a photosensitive material such that the first region of the adhesive layer is configured to undergo a photosensitive reaction based on an external light source, and
wherein the first region is configured to generate a change in physical properties by the photosensitive reaction so that the first region becomes a light absorbing region.

2. The display apparatus of claim 1, wherein
the first region is configured to be colored to a color darker than the second region by the photosensitive reaction.

3. The display apparatus of claim 1, wherein
each display module of the plurality of display modules further comprises a black matrix disposed between the plurality of inorganic light emitting diodes of the display module.

4. The display apparatus of claim 3, wherein
the black matrix is formed on the cover layer.

5. The display apparatus of claim 3, wherein
the black matrix is formed on the second region.

6. The display apparatus of claim 3, wherein
the first region and the black matrix are formed of different materials.

7. The display apparatus of claim 1, wherein
the adhesive layer is formed of any one of an optical clear adhesive (OCA) or optical clear resin (OCR).

8. The display apparatus of claim 1, wherein
the substrate of each of the plurality of display modules comprises a glass substrate, and a thin film transistor (TFT) layer formed on the glass substrate to drive the plurality of inorganic light emitting diodes.

9. The display apparatus of claim 1, wherein
the adhesive layer comprises a first layer and a second layer, the first layer in contact with the mounting surface of each of the plurality of display modules and comprising the photosensitive material, and the second layer disposed on the first layer and not comprising the photosensitive material.

10. The display apparatus of claim 1, wherein
the substrate of each of the plurality of display modules comprises a block layer disposed on a side of the plurality of display modules opposite to the mounting surface of each of the plurality of display modules.

11. A display apparatus comprising:
a plurality of display modules, each of the plurality of display modules comprising a substrate and a plurality of inorganic light emitting diodes mounted on a mounting surface of the substrate;
a cover layer configured to cover the mounting surface of each of the plurality of display modules; and
an adhesive layer arranged between the cover layer and the mounting surface of each of the plurality of display modules to cause the cover layer to adhere to the mounting surface of each of the plurality of display modules,
wherein the adhesive layer comprises a first region, disposed on a gap formed between the plurality of display modules, and a second region disposed on the mounting surface of each of the plurality of display modules,
wherein the adhesive layer includes a photosensitive material such that the first region of the adhesive layer is configured to undergo a photosensitive reaction based on an external light source, and
wherein each display module of the plurality of display modules further comprises an anisotropic conductive layer configured to electrically connect contact electrodes of the plurality of inorganic light emitting diodes of the display module to pad electrodes of the substrate of the display module.

12. The display apparatus of claim 11, wherein
each display module of the plurality of display modules further comprises a black matrix disposed between the plurality of inorganic light emitting diodes of the display module
the black matrix is formed on the anisotropic conductive layer.

13. The display apparatus of claim 12, wherein
the black matrix is patterned on the anisotropic conductive layer.

14. A display apparatus comprising:
a plurality of display modules, each of the plurality of display modules comprising a substrate and a plurality of inorganic light emitting diodes mounted on a mounting surface of the substrate;
a cover layer configured to cover the mounting surface of each of the plurality of display modules; and
an adhesive layer arranged between the cover layer and the mounting surface of each of the plurality of display modules to cause the cover layer to adhere to the mounting surface of each of the plurality of display modules,
wherein the adhesive layer comprises a first region, disposed on a gap formed between the plurality of display modules, and a second region disposed on the mounting surface of each of the plurality of display modules,
wherein the adhesive layer includes a photosensitive material such that the first region of the adhesive layer is configured to undergo a photosensitive reaction based on an external light source,
wherein the substrate of each of the plurality of display modules comprises a glass substrate, and a thin film transistor (TFT) layer formed on the glass substrate to drive the plurality of inorganic light emitting diodes, and
wherein the substrate of each of the plurality of display modules further comprises a light absorbing layer formed entirely in a mounting surface side of the substrate so as to improve contrast by absorbing external light.

15. A manufacturing method of a display apparatus comprising:
preparing a plurality of display modules, each of the plurality of display modules formed by mounting a plurality of inorganic light emitting diodes on a mounting surface of a respective substrate;
arranging the plurality of display modules to be adjacent to each other;
arranging a photosensitive transparent adhesive layer on the mounting surface of each of the plurality of display modules and arranging a cover layer on the photosensitive transparent adhesive layer to cover the mounting surface of each of the plurality of display modules;
bonding the cover layer to the plurality of display modules through the photosensitive transparent adhesive layer; and
irradiating a light source toward a gap formed between the plurality of display modules from a side of the plurality of display modules opposite to the mounting surface of each of the plurality of display modules.

16. The manufacturing method of claim 15, wherein the irradiating the light source toward the gap comprises irradiating a first region of the photosensitive transparent adhesive layer disposed on the gap such that a photosensitive reaction in the first region occurs by the light source, without irradiating a second region disposed on the mounting surface of each of the plurality of display modules such that the photosensitive reaction does not occur in the second region.

17. The manufacturing method of claim 16, wherein the arranging the photosensitive transparent adhesive layer comprises bonding an optical adhesive, which is formed of any one of an optical clear adhesive (OCA) or optical clear resin (OCR) and comprises a photosensitive material, to the mounting surface of each of the plurality of display modules.

18. The manufacturing method of claim 17, further comprising:
forming a black matrix between the plurality of inorganic light emitting diodes on the mounting surface of each of the plurality of display modules.

19. A display apparatus comprising:
a plurality of display modules, each of the plurality of display modules comprising a substrate and a plurality of inorganic light emitting diodes mounted on a mounting surface of the substrate;
a cover layer configured to cover the mounting surface of each of the plurality of display modules; and
a photosensitive transparent adhesive layer arranged between the cover layer and the mounting surface of the substrate of each of the plurality of display modules to cause the cover layer to adhere to the mounting surface of the substrate of each of the plurality of display modules,
wherein the photosensitive transparent adhesive layer comprises a first region and a second region, the first region disposed on a gap formed between the plurality of display modules and configured to undergo a photosensitive reaction based on an external light source, and the second region disposed on the mounting surface of each of the plurality of display modules, and
wherein the first region is configured to be colored to a color darker than the second region by the photosensitive reaction.

20. The display apparatus of claim 19, wherein the substrate of each of the plurality of display modules comprises a black matrix disposed between the plurality of inorganic light emitting diodes on the substrate.

* * * * *